United States Patent
Yamada

(10) Patent No.: US 11,183,381 B2
(45) Date of Patent: Nov. 23, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Masaki Yamada, Saitama Saitama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/556,335

(22) Filed: Aug. 30, 2019

(65) Prior Publication Data
US 2020/0294786 A1    Sep. 17, 2020

(30) Foreign Application Priority Data

Mar. 15, 2019    (JP) .............................. JP2019-049191

(51) Int. Cl.
*H01L 21/02*    (2006.01)
*H01L 23/522*    (2006.01)
*H01L 23/532*    (2006.01)

(52) U.S. Cl.
CPC ........ *H01L 21/022* (2013.01); *H01L 21/0214* (2013.01); *H01L 21/0217* (2013.01); *H01L 21/02164* (2013.01); *H01L 21/02274* (2013.01); *H01L 23/5226* (2013.01); *H01L 23/5227* (2013.01); *H01L 23/53228* (2013.01)

(58) Field of Classification Search
CPC ............................................... H01L 21/76804
See application file for complete search history.

(56) References Cited

U.S. PATENT DOCUMENTS

| 9,024,443 | B2 | 5/2015 | Inaba et al. |
| 2014/0061929 | A1* | 3/2014 | Inaba ..................... H01L 23/52 |
| | | | 257/762 |
| 2018/0337084 | A1* | 11/2018 | Blennerhassett ....... H01F 17/00 |
| 2019/0035734 | A1* | 1/2019 | Ho .................... H01L 23/53295 |

FOREIGN PATENT DOCUMENTS

| JP | H08-107106 | A | 4/1996 |
| JP | H09-283624 | A | 10/1997 |
| JP | 2006-080244 | A | 3/2006 |
| JP | 2007-027291 | A | 2/2007 |
| JP | 5835696 | B2 | 12/2015 |

* cited by examiner

*Primary Examiner* — Moazzam Hossain
*Assistant Examiner* — Stanetta D Isaac
(74) *Attorney, Agent, or Firm* — Allen & Overy, LLP

(57) ABSTRACT

A semiconductor device of the embodiment includes first and second conductive layer; a silicon nitride layer between the first conductive layer and the second conductive layer; a silicon oxide layer between the silicon nitride layer and the second conductive layer; a silicon oxynitride layer between the silicon oxide layer and the second conductive layer; and a third conductive layer between the first conductive layer and the second conductive layer, the third conductive layer electrically connected to the first and second conductive layer, a first tilt angle of a plane where the third conductive layer is in contact with the silicon oxynitride layer with respect to an interface between the silicon nitride layer and the silicon oxide layer is smaller than a second tilt angle of a plane where the third conductive layer is in contact with the silicon oxide layer with respect to the interface.

10 Claims, 12 Drawing Sheets

SEMICONDUCTOR DEVICE

CROSS-REFERENCE TO RELATED APPLICATION

This application is based upon and claims the benefit of priority from Japanese Patent Application No. 2019-049191, filed on Mar. 15, 2019, the entire contents of which are incorporated herein by reference.

FIELD

Embodiments described herein relate generally to semiconductor devices.

BACKGROUND

In industrial semiconductors, medical semiconductors, or in-vehicle semiconductors, signal isolation is required to cut off the current from the high voltage part to transmit digital signals. In an isolator (insulated converter) in which signals are transmitted using magnetic coils, two coils face each other on a semiconductor substrate via a thick insulating layer in order to secure withstand voltage.

For example, in order to obtain electrical conduction to the signal processing circuit formed on the semiconductor substrate of the isolator, it is necessary to connect the lower wiring layer and the upper wiring layer provided via a thick insulating layer. The lower wiring layer and the upper wiring layer are connected by forming a connection hole penetrating the thick insulating layer and embedding metal in the connection hole. In order to suppress delay in signal transmission, it is preferable to connect the lower wiring layer and the upper wiring layer with a low resistance.

DETAILED DESCRIPTION

Figure 1:
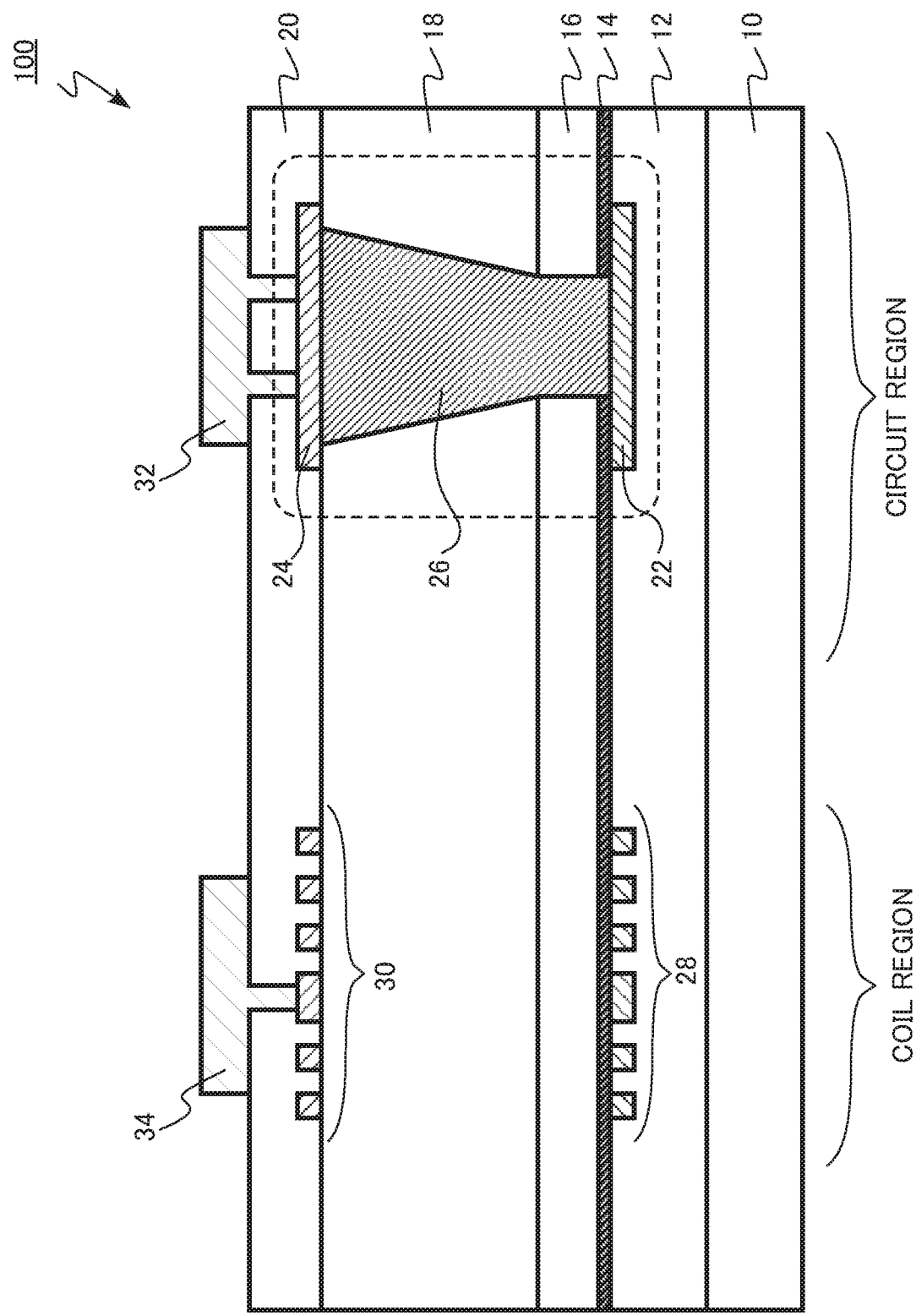
FIG. 1 is a schematic cross-sectional view of a semiconductor device of an embodiment.

A semiconductor device according to one aspect of the present disclosure includes: a first conductive layer containing copper; a second conductive layer containing copper; a silicon nitride layer provided between the first conductive layer and the second conductive layer; a silicon oxide layer provided between the silicon nitride layer and the second conductive layer and thicker than the silicon nitride layer; a silicon oxynitride layer provided between the silicon oxide layer and the second conductive layer and thicker than the silicon oxide layer; and a third conductive layer provided between the first conductive layer and the second conductive layer, the third conductive layer containing copper and electrically connected to the first conductive layer and the second conductive layer, in which a first tilt angle of a plane where the third conductive layer is in contact with the silicon oxynitride layer with respect to a plane parallel to an interface between the silicon nitride layer and the silicon oxide layer is smaller than a second tilt angle of a plane where the third conductive layer is in contact with the silicon oxide layer with respect to a plane parallel to the interface.

In the present specification, the same or similar members will be denoted by the same reference symbols, and overlapping descriptions may be omitted.

In this specification, the upper direction of the drawing may be described as "upper" and the lower direction of the drawing as "lower" to indicate the positional relationship of parts and the like. In the present specification, the terms "upper" and "lower" are not necessarily terms indicating the relationship with the direction of gravity.

Qualitative analysis and quantitative analysis of the chemical composition of members constituting the semiconductor device in the present specification can, for example, be performed by secondary ion mass spectroscopy (SIMS) or energy dispersive X-ray spectroscopy (EDX). In addition, for example, a scanning electron microscope (SEM) or a transmission electron microscope (TEVI) can be used to measure the thickness of the members constituting the semiconductor device, the distance between the members, and the like.

A semiconductor device according to an embodiment includes a first conductive layer containing copper; a second conductive layer containing copper; a silicon nitride layer provided between the first conductive layer and the second conductive layer; a silicon oxide layer provided between the silicon nitride layer and the second conductive layer and thicker than the silicon nitride layer; a silicon oxynitride layer provided between the silicon oxide layer and the second conductive layer and thicker than the silicon oxide layer; and a third conductive layer provided between the first conductive layer and the second conductive layer, the third conductive 2r; layer containing copper and electrically connected to the first conductive layer and the second conductive layer. A first tilt angle of a plane where the third conductive layer is in contact with the silicon oxynitride layer with respect to a plane parallel to an interface between the silicon nitride layer and the silicon oxide layer is smaller than a second tilt angle of a plane where the third conductive layer is in contact with the silicon oxide layer with respect to a plane parallel to the interface.

FIG. A is a schematic cross-sectional view of the semiconductor device of the embodiment. The semiconductor device of the embodiment is an isolator 100. The isolator 100 transmits a signal using a magnetic coil. The isolator 100 has a via (vertical interconnect access) structure.

Figure 2:
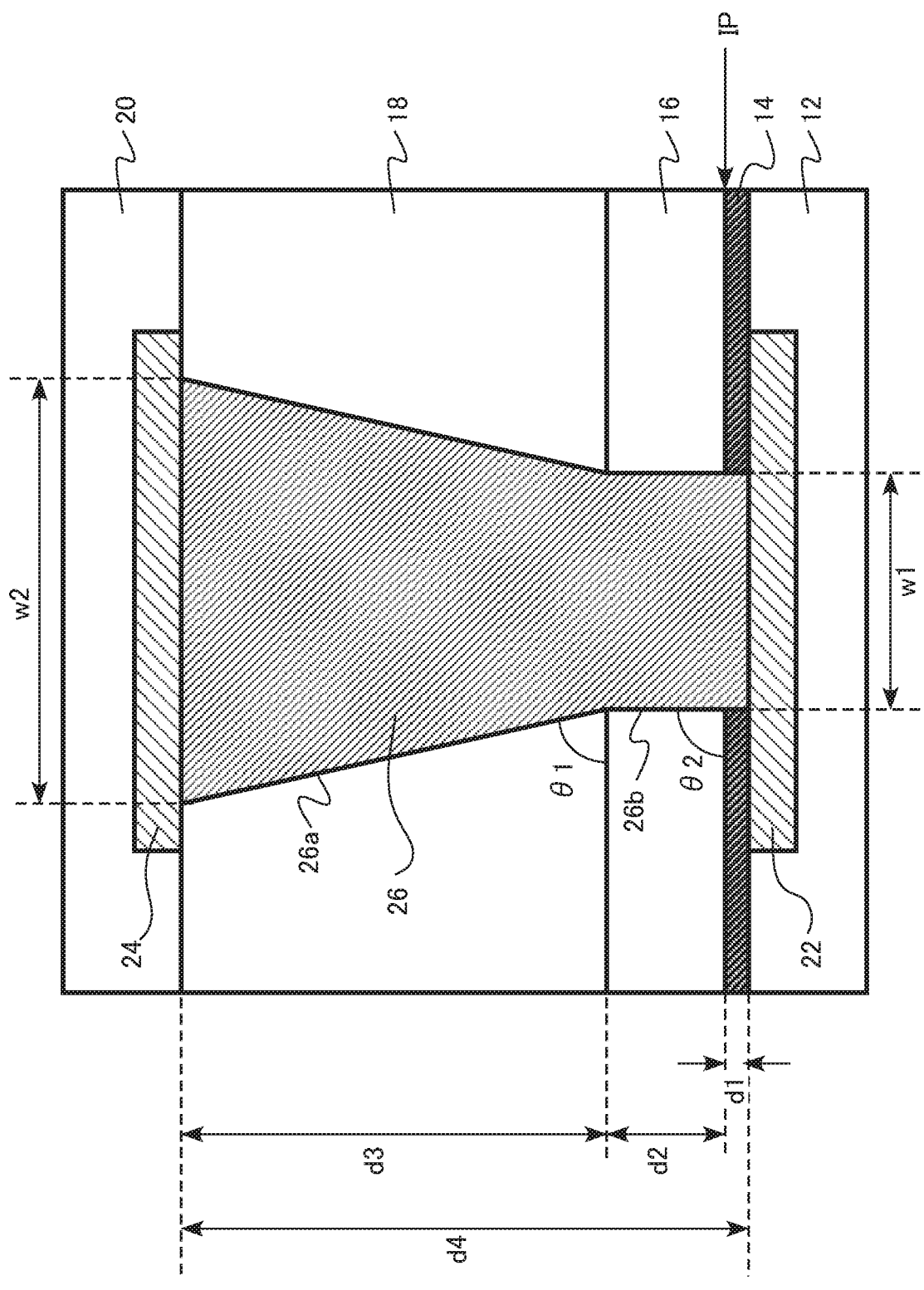
FIG. 2 is an enlarged schematic cross-sectional view of a part of the semiconductor device of the embodiment.

FIG. 2 is an enlarged schematic cross-sectional view of a part of the semiconductor device of the embodiment. FIG. 2 is a cross-sectional views of the via structure (a region surrounded by a dotted frame in FIG. 1) of the isolator 100.

The isolator 100 includes a silicon substrate 10, an interlayer insulating layer 12, a silicon nitride layer 14, a silicon oxide layer 16, a silicon oxynitride layer 18, a protective insulating layer 20, a lower wiring layer 22 (first conductive layer), an upper wiring layer 24 (second conductive layer), a via plug 26 (third conductive layer), a lower coil 28 (first coil), an upper coil 30 (second coil), a first pad electrode 32, and a second pad electrode 34.

The isolator 100 includes a coil region and a circuit region. The coil region and the circuit region are formed on the same silicon substrate 10.

The lower coil 28, the upper coil 30, and the second pad electrode 34 are provided in the coil region. The coil region has a function of transmitting a signal-insulated digital signal using magnetic coupling of the lower coil 28 and the upper coil 30.

For example, a signal processing circuit (not shown) is formed in the circuit region. The signal processing circuit is configured using, for example, an element such as a transistor formed on the silicon substrate 10. The circuit region processes a signal input from the outside to the coil region or a signal output from the coil region to the outside.

A via structure is formed in the circuit region. The via structure has, for example, a function of transmitting a signal processed by the signal processing circuit to the first pad electrode 32 from the signal processing circuit. Also, the via structure has a function of transmitting, for example, a signal input to the first pad electrode 32 to the signal processing circuit.

The silicon substrate 10 is, for example, single crystal silicon. The thickness of the silicon substrate 10 is, for example, equal to or more than 500 μm and equal to or less than 1000 μm.

The interlayer insulating layer 12 is provided on the silicon substrate 10. The interlayer insulating layer 12 is, for example, silicon oxide.

The lower wiring layer 22 is provided in the interlayer insulating layer 12. The lower wiring layer 22 is electrically connected to, for example, an element that constitutes a processing circuit (not shown). The lower wiring layer 22 contains copper (Cu). The lower wiring layer 22 is, for example, copper (Cu).

The silicon nitride layer 14 is provided between the lower wiring layer 22 and the upper wiring layer 24. The silicon nitride layer 14 is provided on the lower wiring layer 22. The silicon nitride layer 14 is in contact with the upper surface of the lower wiring layer 22.

The thickness (d1 in FIG. 2) of the silicon nitride layer 14 is, for example, equal to or more than 0.2 μm and equal to or less than 1 μm.

The silicon oxide layer 16 is provided between the silicon nitride layer 14 and the upper wiring layer 24. The silicon oxide layer 16 is in contact with the silicon nitride layer 14.

The thickness (d2 in FIG. 2) of the silicon oxide layer 16 is thicker than the thickness d1 of the silicon nitride layer 14.

The thickness d2 of the silicon oxide layer 16 is, for example, equal to or more than 2 μm and equal to or less than 4 μm.

The silicon oxynitride layer 18 is provided between the silicon oxide layer 16 and the upper wiring layer 24. The silicon oxynitride layer 18 is in contact with the silicon oxide layer 16.

The thickness (d3 in FIG. 2) of the silicon oxynitride layer 18 is thicker than the thickness d2 of the silicon oxide layer 16. The thickness d3 of the silicon oxynitride layer 18 is, for example, equal to or more than 4 μm and equal to or less than 20 μm.

The protective insulating layer 20 is provided on the silicon oxynitride layer 18. The protective insulating layer 20 is, for example, silicon oxide.

The upper wiring layer 24 is provided in the protective insulating layer 20. The upper wiring layer 24 contains copper (Cu). The upper wiring layer 24 is, for example, copper (Cu).

The distance (d4 in FIG. 2) between the lower wiring layer 22 and the upper wiring layer 24 is, for example, equal to or more than 6 μm and equal to or less than 25 μm.

The via plug 26 is provided between the lower wiring layer 22 and the upper wiring layer 24. The via plug 26 is electrically connected to the lower wiring layer 22 and the upper wiring layer 24. The via plug 26 is in contact with the lower wiring layer 22 and the upper wiring layer 24.

The via plug 26 contains copper (Cu). The via plug 26 is, for example, copper (Cu).

A first tilt angle (θ1 in FIG. 2) of a plane 26a where the via plug 26 is in contact with the silicon oxynitride layer 18 with respect to a plane parallel to an interface (IP in FIG. 2) between the silicon nitride layer 14 and the silicon oxide layer 16 is smaller than a second tilt angle (92 in FIG. 2) of a plane 26b where the via plug 26 is in contact with the silicon oxide layer 16 with respect to a plane parallel to the interface (IP in FIG. 2) between the silicon nitride layer 14 and the silicon oxide layer 16.

The first tilt angle θ1 is, for example, equal to or more than 70 degrees and less than 85 degrees. The second tilt angle θ2 is, for example, equal to or more than 85 degrees and equal to or less than 90 degrees.

The width (w1 in FIG. 2) of a plane where the lower wiring layer 22 and the via plug 26 are in contact with each other is, for example, equal to or more than 6 μm and equal to or less than 10 μm. The width (w2 in FIG. 2) of a plane where the upper wiring layer 24 and the via plug 26 are in contact with each other is, for example, equal to or more than 10 μm and equal to or less than 15 μm.

The first pad electrode 32 is provided on the upper wiring layer 24. The first pad electrode 32 is electrically connected to the upper wiring layer 24. The first pad electrode 32 is, for example, an aluminum alloy.

The lower coil 28 is provided in the interlayer insulating layer 12. The lower coil 28 is electrically connected to, for example, an element that constitutes a processing circuit (not shown).

The lower coil 28 contains copper (Cu). The lower coil 28 is, for example, copper (Cu). The lower coil 28 and the lower wiring layer 22 are simultaneously formed of, for example, the same material.

The upper coil 30 is provided in the protective insulating layer 20.

The upper coil 30 contains copper (Cu). The upper coil 30 is, for example, copper (Cu). The upper coil 30 and the upper wiring layer 24 are simultaneously formed of, for example, the same material.

Figure 3B:
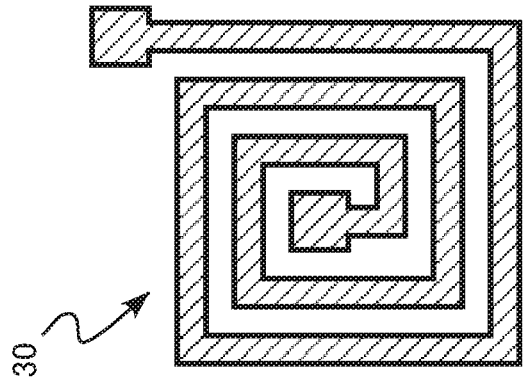
FIG. 3B is a schematic plan view of an upper coil of the embodiment.
Figure 3A:
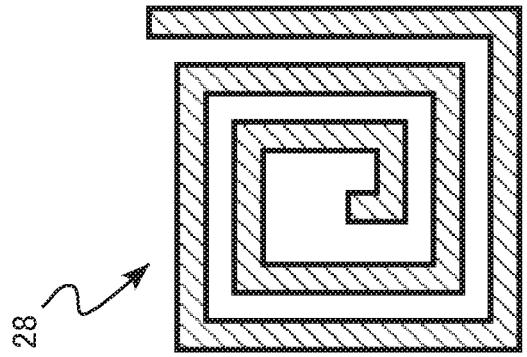
FIG. 3A is a schematic plan view of a lower coil of the embodiment.

FIG. 3A and FIG. 3B are schematic plan views of the lower coil and the upper coil of the embodiment, respectively. FIG. 3A shows the lower coil, and FIG. 3B shows the upper coil. The lower coil 28 and the upper coil 30 are patterned in a spiral shape in a plane.

The silicon nitride layer 14, the silicon oxide layer 16, and the silicon oxynitride layer 18 are provided between the lower coil 28 and the upper coil 30. The withstand voltage between the lower coil 28 and the upper coil 30 is guaranteed by the silicon nitride layer 14, the silicon oxide layer 16, and the silicon oxynitride layer 18.

Silicon oxynitride has a higher withstand voltage per unit thickness compared to silicon oxide. Therefore, the distance (d4 in FIG. 2) between the lower wiring layer 22 and the upper wiring layer 24 can be shortened by applying the silicon oxynitride layer 18. Therefore, magnetic coupling between the lower coil 28 and the upper coil 30 is strengthened, and the signal transmission characteristic of the isolator 100 can be improved. [0055] Further, by shortening the distance (d4 in. FIG. 2) between the lower wiring layer 22 and the upper wiring layer 24, it is possible to reduce the aspect ratio (depth/diameter) of the connection hole 54. Therefore, it is easy to reduce the resistance of the connection between the lower wiring layer 22 and the upper wiring layer 24. Also from this point, the signal transmission characteristic of the isolator 100 can be improved by applying the silicon oxynitride layer 18.

The second pad electrode 34 is provided on the upper coil 30. The second pad electrode 34 is electrically connected to the upper coil 30. The second pad electrode 34 is, for example, an aluminum alloy.

Next, a method of manufacturing the semiconductor device of the embodiment will be described. The manufacturing method of the semiconductor device of the embodiment is a manufacturing method of the isolator 100 having a via structure.

FIGS. 4, 5, 6, 7, 8, 9, 10, and 11 are schematic cross-sectional views showing the method of manufacturing the semiconductor device of the embodiment. FIGS. 4, 5, 6, 7, 8, 9, 10, and 11 are cross-sectional views of the via structure of the isolator 100.

First, an element such as a transistor (not shown) is formed on the silicon substrate 10 using a known manufacturing method. Furthermore, the interlayer insulating layer 12 is formed on the silicon substrate 10. The interlayer insulating layer 12 is formed by using, for example, a chemical vapor deposition method (CVD method).

Next, the lower wiring layer 22 of copper is formed using, for example, a known damascene method. At this time, the lower coil 28 is also formed simultaneously.

Next, the silicon nitride layer 14 is formed on the interlayer insulating layer 12, the lower wiring layer 22, and the lower coil 28. The silicon nitride layer 14 is formed by, for example, a plasma CVD method.

Next, the silicon oxide layer 16 thicker than the silicon nitride layer 14 is formed on the silicon nitride layer 14. The silicon oxide layer 16 is formed, for example, by a plasma CVD method.

Next, the silicon oxynitride layer 18 thicker than the silicon oxide layer 16 formed silo icon oxide layer 16. The silicon oxynitride layer 18 is formed, for example, by a plasma CVD method.

Figure 4:
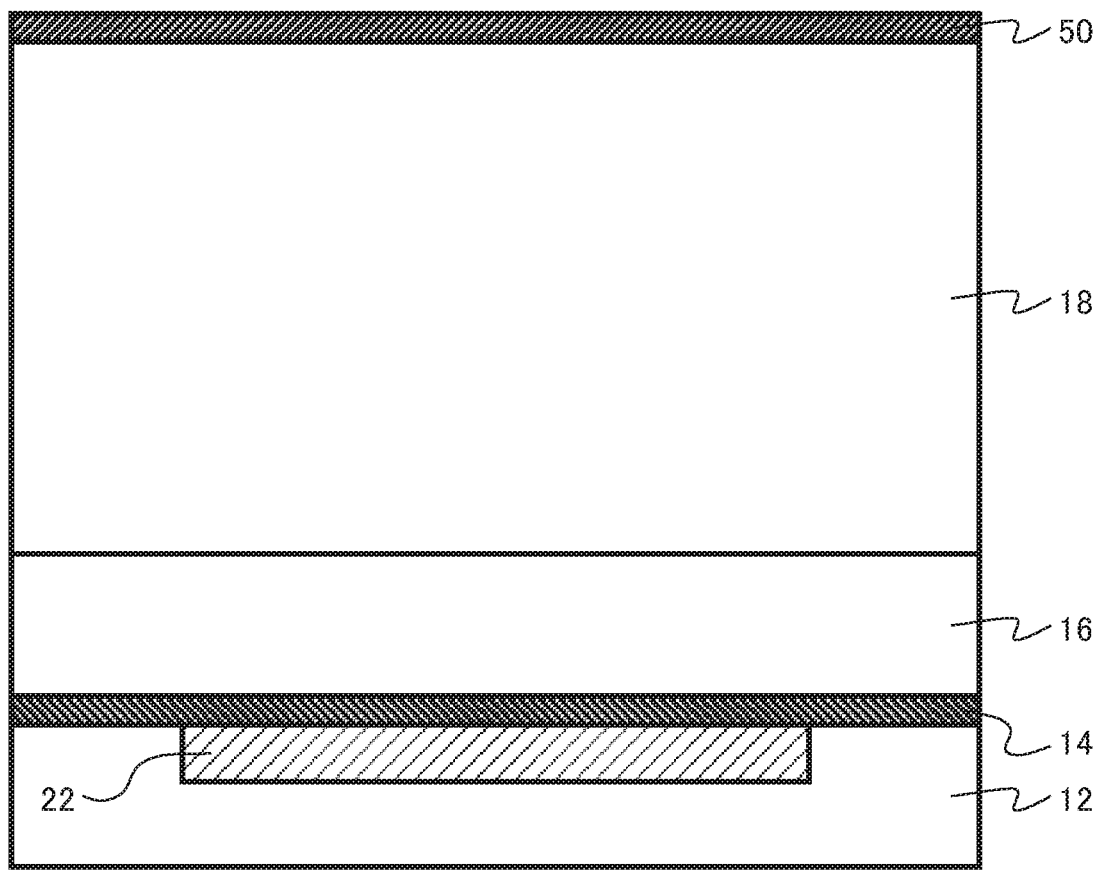
FIG. 4 is a schematic cross-sectional view showing a method of manufacturing the semiconductor device of the embodiment.

Next, a mask material 50 is formed on the silicon oxynitride layer 18 (FIG. 4). The mask material 50 is a silicon nitride film. The mask material 50 is formed, for example, by a plasma CVD method.

Figure 5:
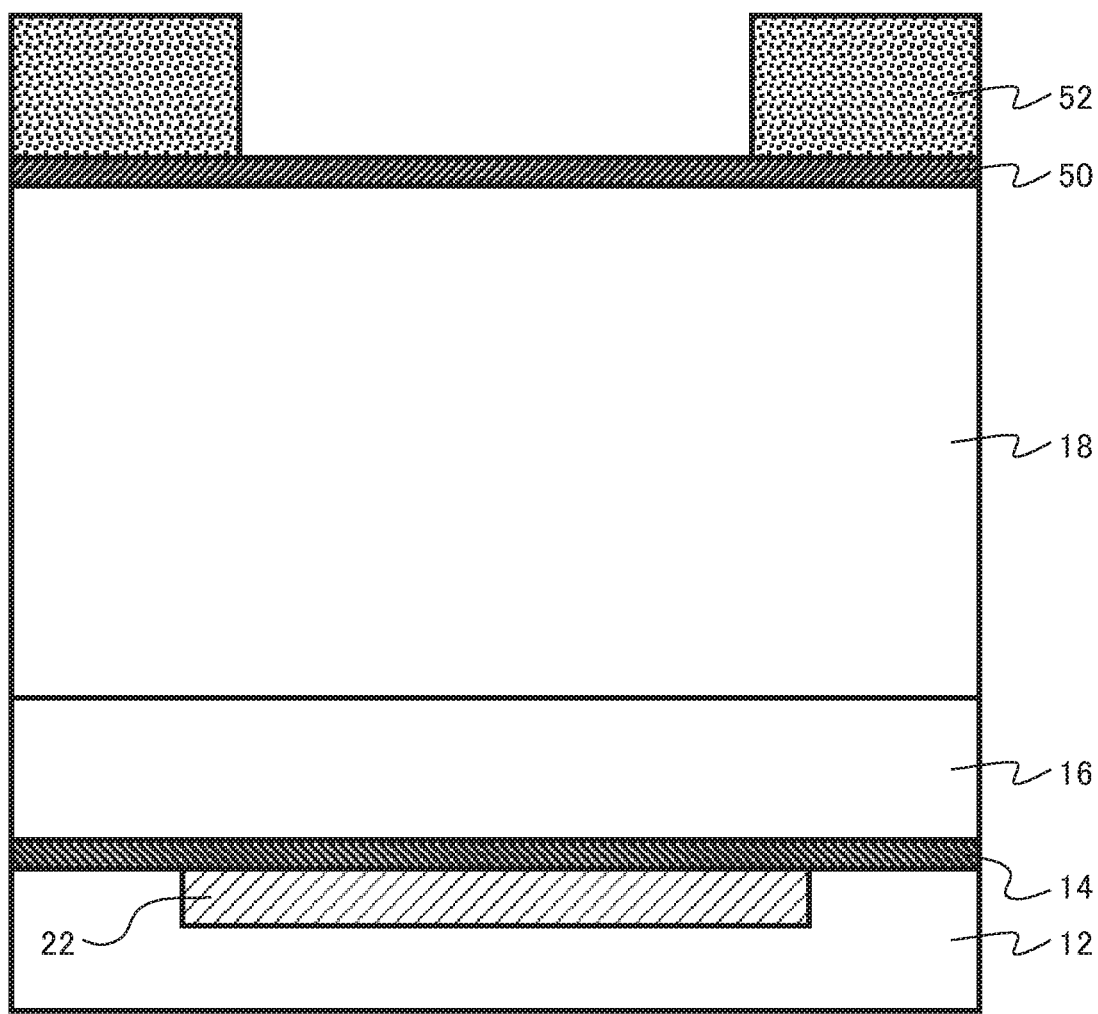
FIG. 5 is a schematic cross-sectional view showing the method of manufacturing the semiconductor device of the embodiment.

Next, a resist pattern 52 is formed on the mask material 50 by photolithography (FIG. 5).

Figure 6:
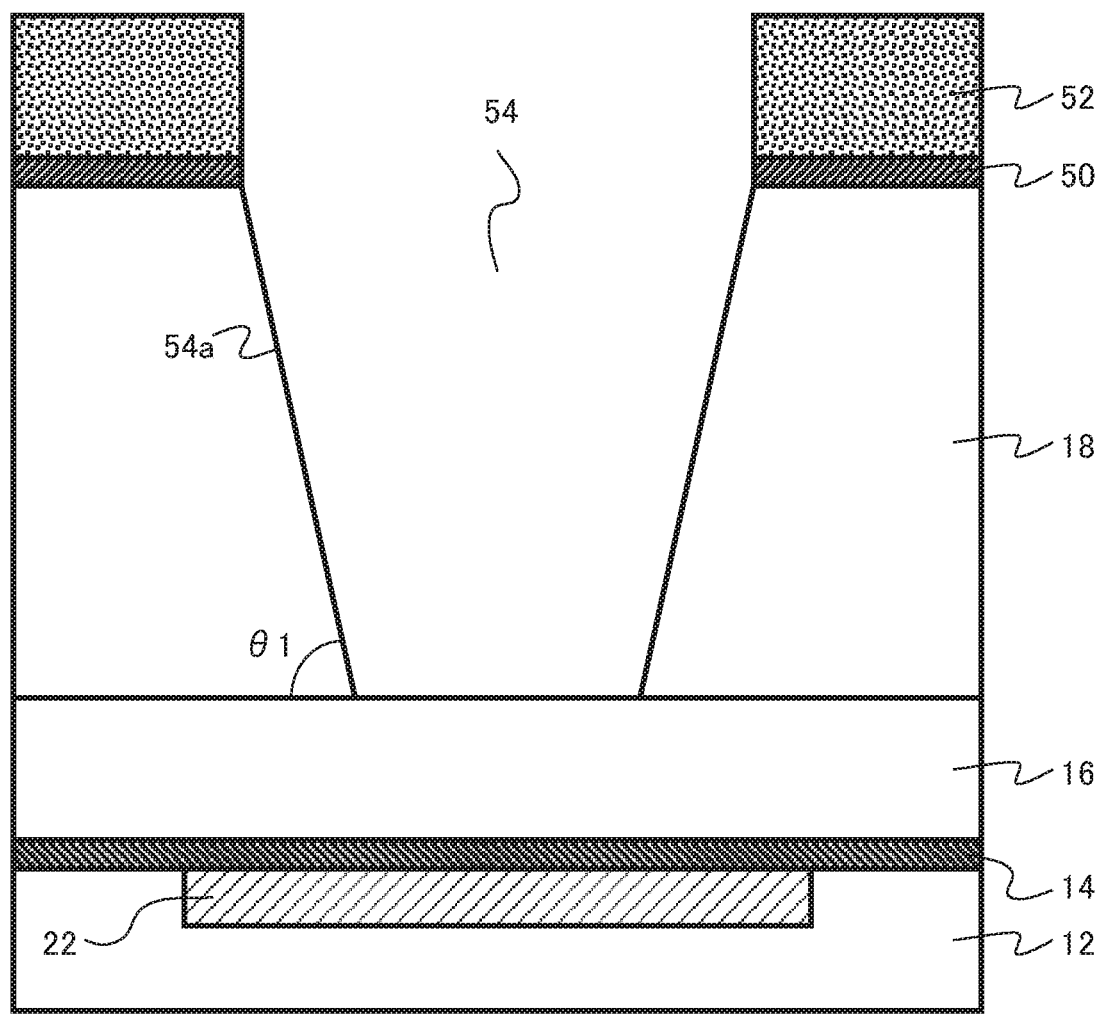
FIG. 6 is a schematic cross-sectional view showing the method of manufacturing the semiconductor device of the embodiment.

Next, using the resist pattern 52 as a mask, the mask material 50 is patterned using reactive ion etching (RIE). Further, the silicon oxynitride layer 18 is etched to form the connection hole 54 (FIG. 6). At this time, the etching conditions are controlled so that the first tilt angle θ1 of the inner surface 54a of the silicon oxynitride layer 18 of the connection hole 54 is, for example, equal to or more than 70 degrees and less than 85 degrees.

Silicon oxynitride is easy to etch to reduce the tilt of the inner surface of the connection hole 54 due to the characteristics of the material, as compared to, for example, silicon oxide.

Figure 7:
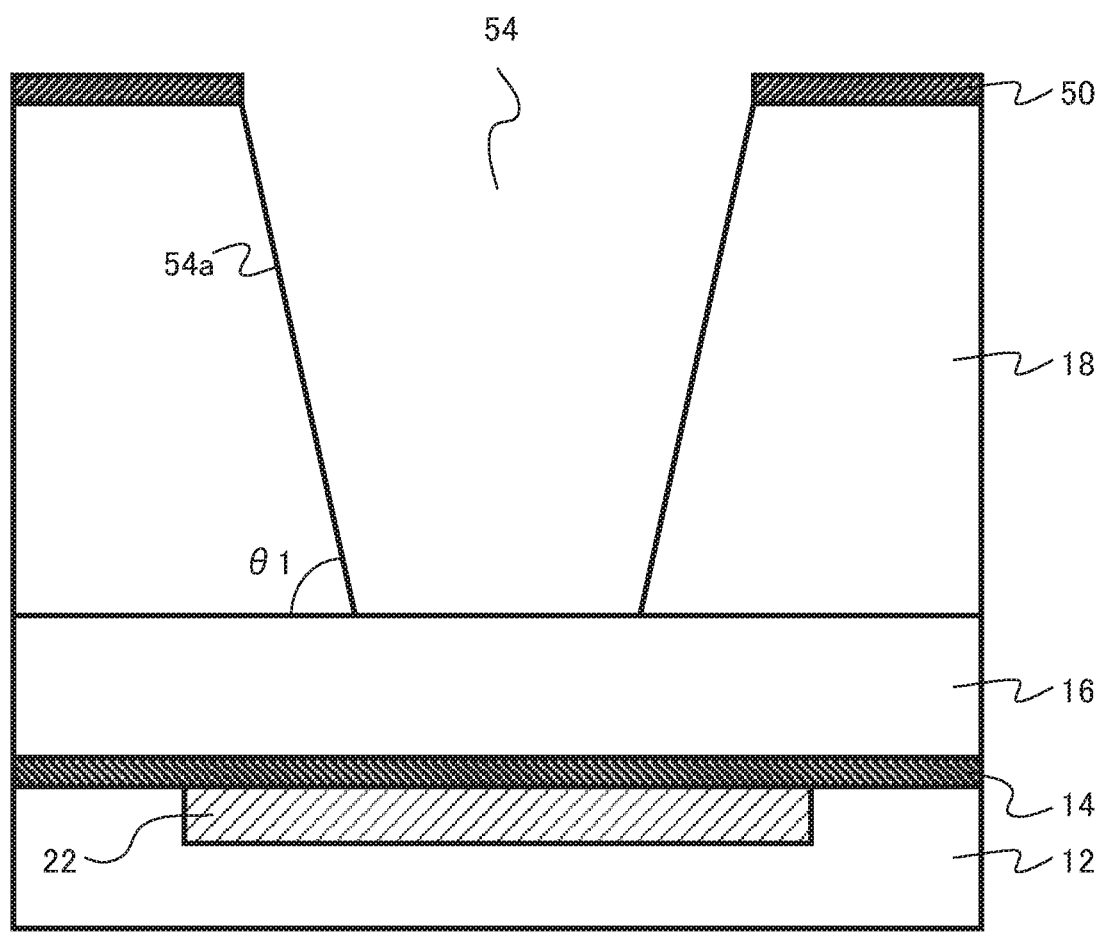
FIG. 7 is a schematic cross-sectional view showing the method of manufacturing the semiconductor device of the embodiment.

Next, the resist, pattern 52 is removed (FIG. 7).

Figure 8:
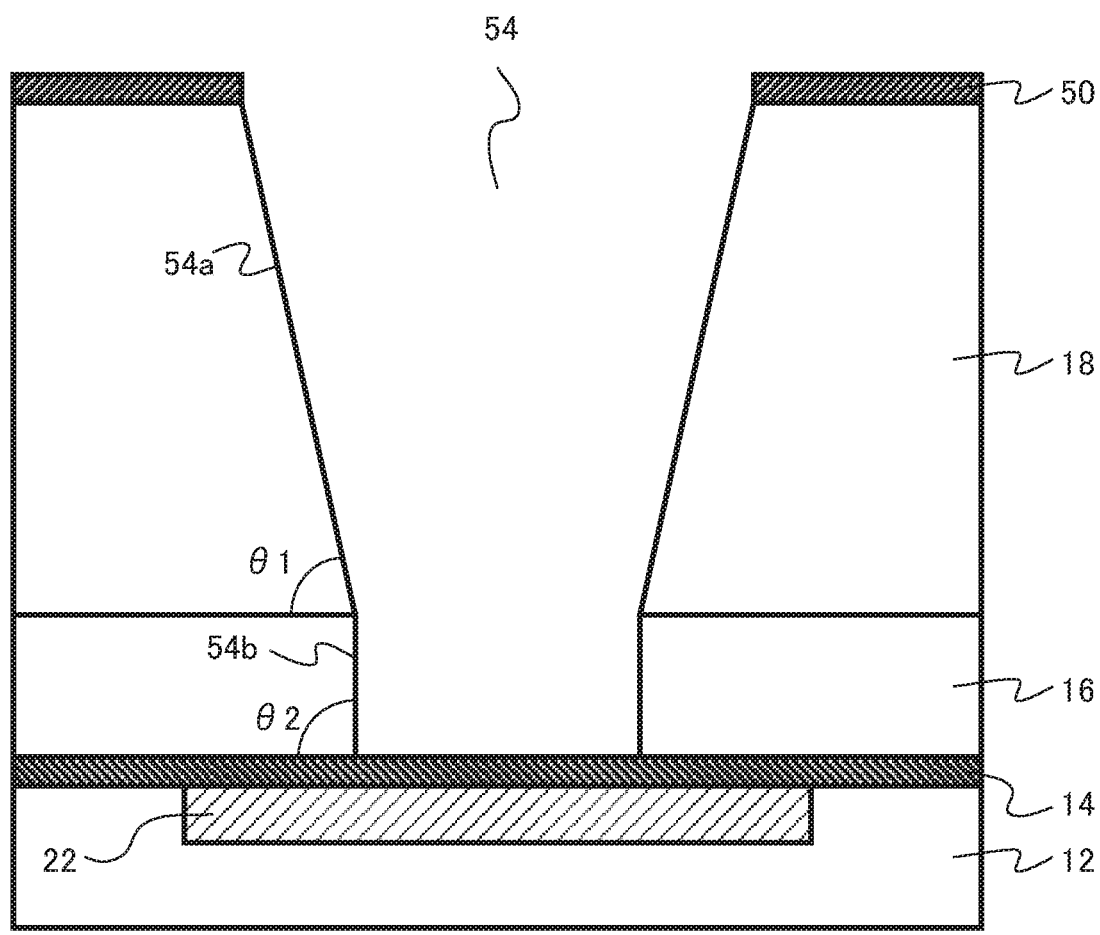
FIG. 8 is a schematic cross-sectional view showing the method of manufacturing the semiconductor device of the embodiment.

Next, RIG is performed using the mask material 50 as a mask to etch the silicon oxide layer 16 (FIG. 8). At this time, an etching condition is selected in which the etching rate of the silicon oxide layer 16 with respect to the silicon nitride layer 14 is fast, and the etching rate of the silicon oxide layer 16 with respect to the silicon oxynitride layer 18 is fast. The silicon nitride layer 14 functions as a stopper layer for etching.

Silicon oxide can easily increase the etching rate to silicon nitride as compared to silicon oxynitride. Therefore, by sandwiching the silicon oxide layer 16 between the silicon nitride layer 14 and the silicon oxynitride layer 18, it becomes easy to stop the etching of the connection hole 54 by the silicon nitride layer 14 and the processing accuracy of the connection hole 54 is improved.

When the silicon oxide layer 16 is etched, the etching conditions are controlled so that the second tilt. angle θ2 of the inner surface 54b of the silicon oxide layer 16 in the connection hole 54 becomes larger than the first tilt angle θ1. For example, the etching conditions are controlled so that the second tilt angle θ2 is equal to or more than 85 degrees and equal to or less than 90 degrees.

Figure 9:
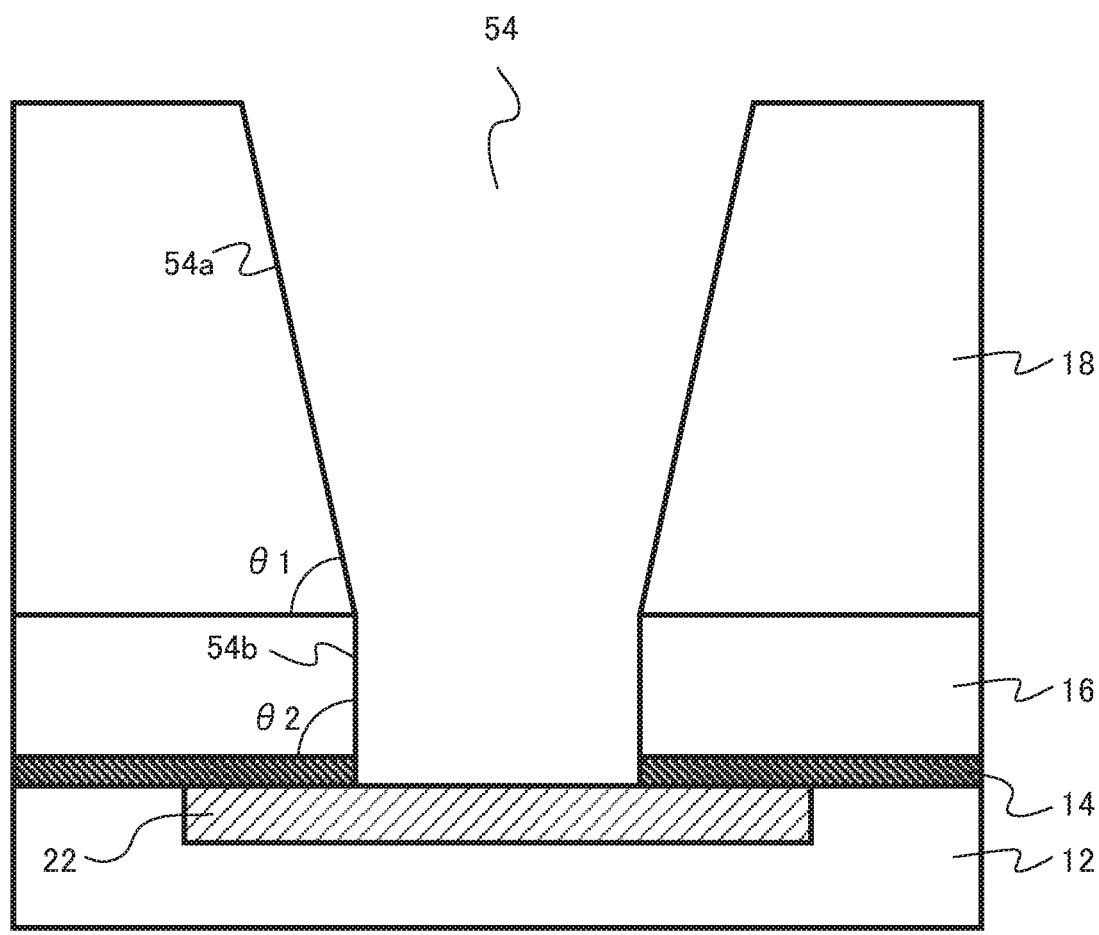
FIG. 9 is a schematic cross-sectional view showing the method of manufacturing the semiconductor device of the embodiment.

Next, without providing a mask, so-called overall RIE is performed to remove the silicon nitride layer 14 at the bottom of the connection hole 54 (FIG. 9). At this time, the mask material 50 on the silicon oxynitride layer 18 is also removed. The lower wiring layer 22 is exposed at the bottom of the connection hole 54.

Next, a tantalum film and a copper film (not shown) are formed on the inner surface of the connection hole 54 and the upper surface of the silicon oxynitride layer 18. The tantalum film and the copper film are formed, for example, by sputtering. The tantalum film functions as a diffusion prevention film of copper. The copper film will be a seed layer in the subsequent formation of a metal film by electrolytic plating.

Figure 10:
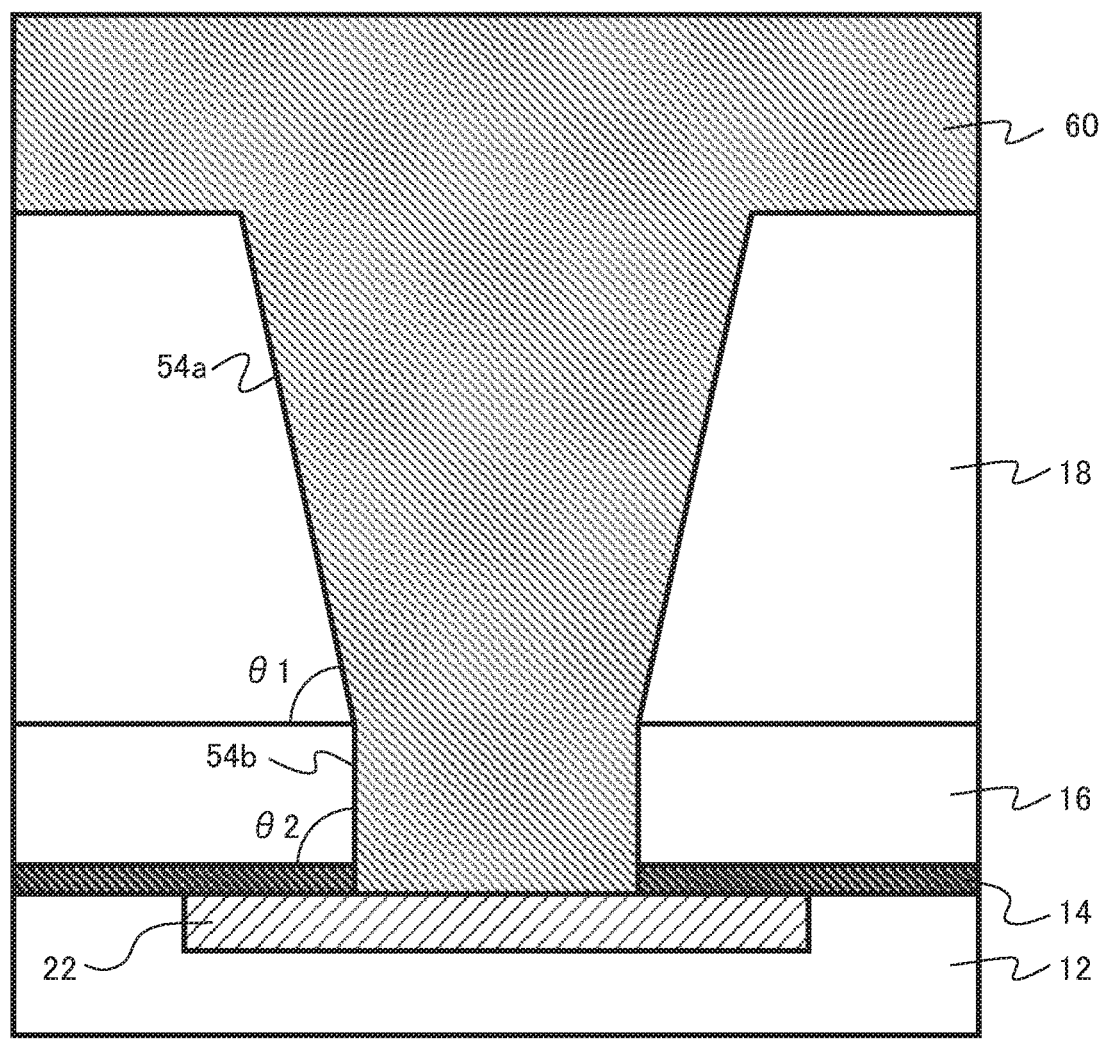
FIG. 10 is a schematic cross-sectional view showing the method of manufacturing the semiconductor device of the embodiment.

Next, a metal film 60 is formed by electrolytic plating using a copper film (not shown) as a seed layer (FIG. 10). The connection hole 54 is embedded with the metal film 60. The metal film is a copper film.

Figure 11:
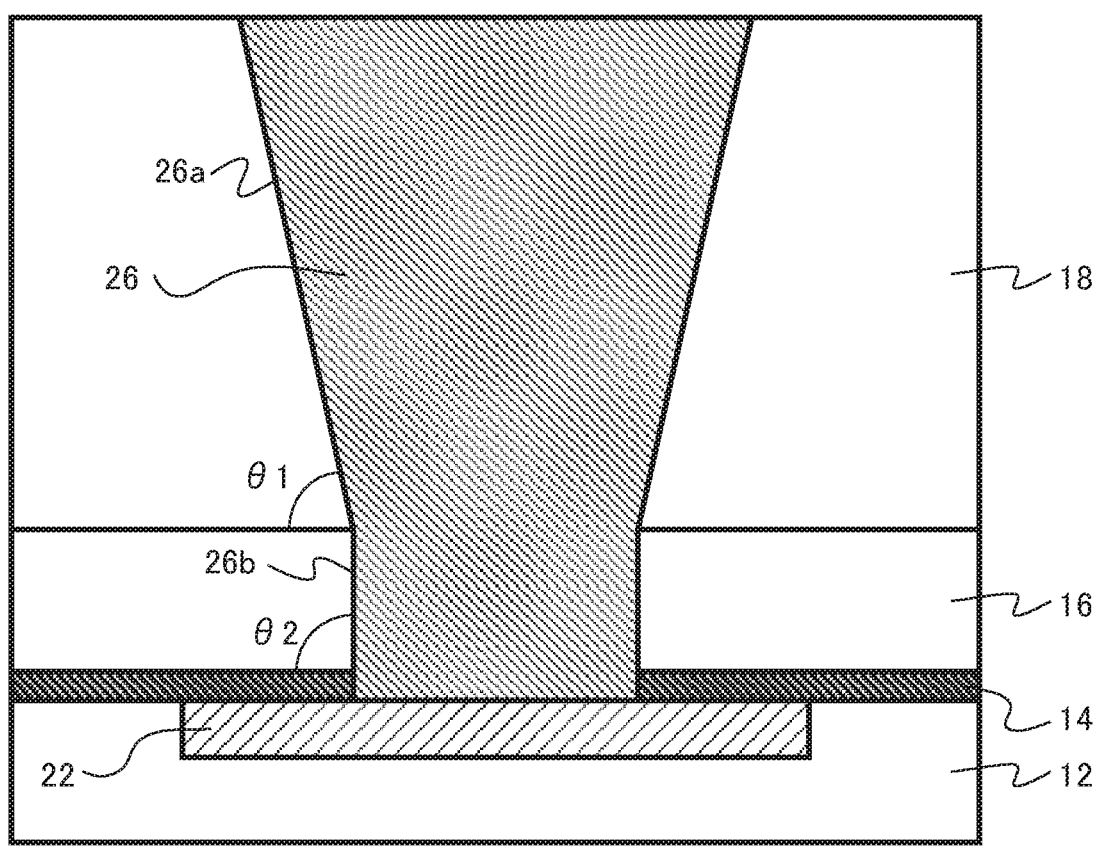
FIG. 11 is a schematic cross-sectional view showing the method of manufacturing the semiconductor device of the embodiment.

Next, the metal film 60 on the silicon oxynitride layer 18 is removed by Cmemi-Mechanical Polishing method (CMP method) (FIG. 11).

Next, the protective insulating layer 20 is formed by a plasma CVD method. Next, the upper wiring layer 24 of copper is formed by a known damascene method. At this time, the upper coil 30 is also formed simultaneously.

Thereafter, the first pad electrode 32 and the second pad electrode 34 are formed.

The isolator 100 shown in FIG. 1 is formed by the above manufacturing method.

Hereinafter, the function and effect of the semiconductor device of the embodiment will be described.

In industrial semiconductors, medical semiconductors, or in-vehicle semiconductors, signal isolation is required to cut off the current from the high voltage part to transmit digital signals. In an isolator (insulated converter) in which signals are transmitted using magnetic coils, two coils face each other on a semiconductor substrate via a thick insulating layer in order to secure withstand voltage.

For example, in order to obtain electrical conduction to the signal processing circuit formed on the semiconductor substrate of the isolator, it is necessary to connect the lower layer wiring and the upper layer wiring provided via the thick insulating layer. The lower layer wiring and the upper layer wiring are connected by forming a connection hole penetrating the thick insulating layer and embedding metal in the connection hole. In order to suppress the delay of signal transmission, it is preferable to connect the lower layer wiring and the upper layer wiring with a low resistance.

Figure 12:
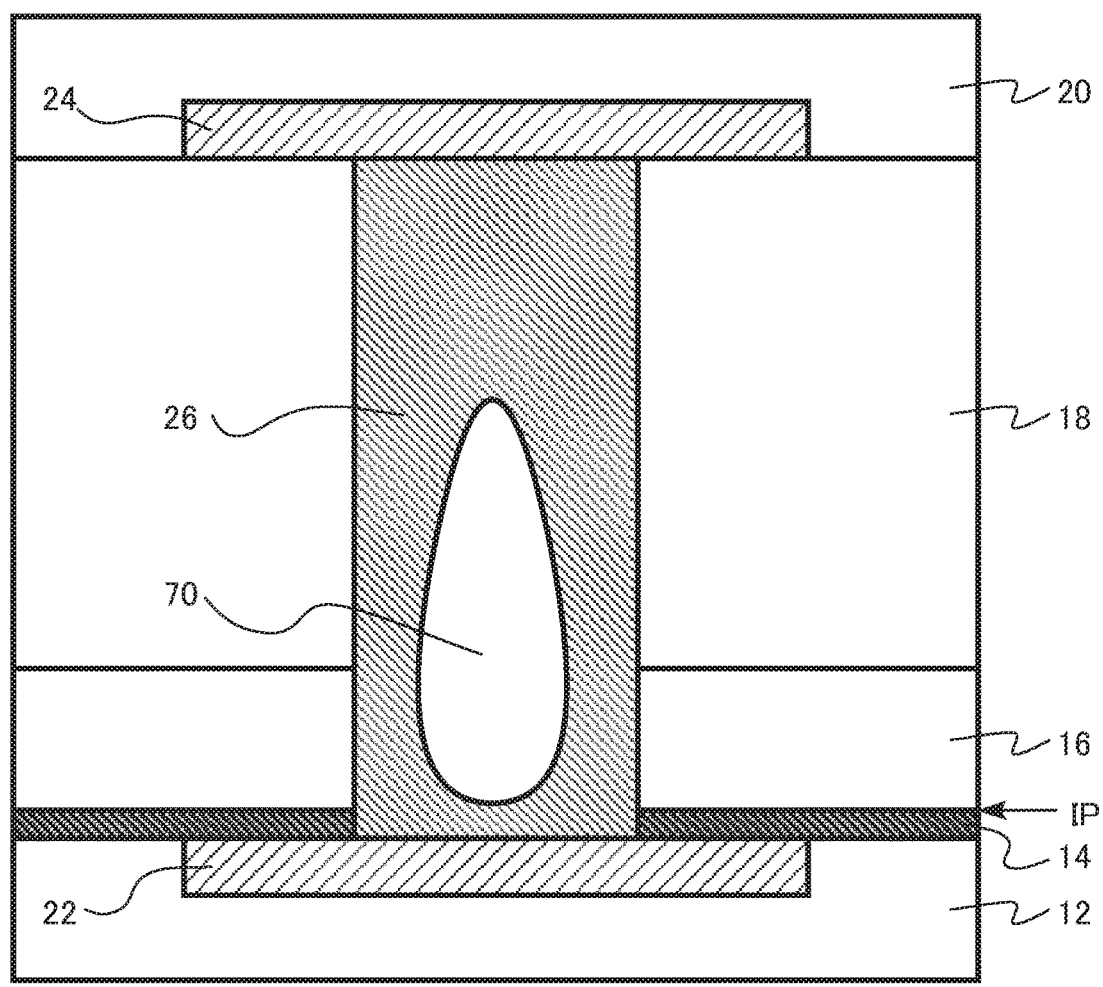
FIG. 12 is an enlarged schematic cross-sectional view of a part of a semiconductor device of a comparative embodiment.

FIG. 12 is an enlarged schematic cross-sectional view of a part of a semiconductor device of a comparative embodiment. The semiconductor device of the comparative embodiment is an isolator. FIG. 12 is a cross-sectional view of the via structure of the isolator of the comparative embodiment. FIG. 12 is a cross-sectional view corresponding to FIG. 2.

The via structure of the isolator of the comparative example is similar to the via structure of the isolator 100 according to the embodiment except that the portion of the via plug 26 in contact with the silicon oxynitride layer 18 is vertical.

As shown in FIG. 12, for example, a void 70 occurs in the via plug 26. The occurrence of the void 70 is not preferable because the resistance of the via plug 26 increases and the connection resistance between the lower layer wiring and the upper layer wiring increases.

The void 70 occurs because the portion of the via plug 26 in contact with the silicon oxynitride layer 18 is vertical, that is, the tilt of the inner surface of the connection hole is vertical before the metal film is embedded. For example, when the connection hole is embedded by the electrolytic plating method, the formation of the seed layer is insufficient, and the metal film cannot fill the inside of the connection hole, so that the void 70 occurs. Alternatively, since the growth rate of the metal film by the electrolytic plating method is slowed at the bottom of the connection hole, the void 70 occurs.

For example, although it is also conceivable to simply increase the diameter of the connection hole, this is not preferable because it causes an increase in the chip area. In addition, although it is also conceivable to tilt the inner surface of the connection hole from the top to the bottom, in this case, the contact resistance between the via plug 26 and the lower wiring layer 22 increases and the connection resistance between the lower layer wiring and the upper layer wiring increases, which is unfavorable.

In the via structure of the isolator 100 according to the embodiment, the first tilt angle (91 in FIG. 2) of the plane 26a where the via plug 26 is in contact with the silicon oxynitride layer 18 with respect to the plane parallel to an interface (IP in FIG. 2) between the silicon nitride layer 14 and the silicon oxide layer 16 is smaller than the second tilt angle ($\theta 2$ in FIG. 2) of the plane 26b where the via plug 26 is in contact with the silicon oxide layer 16 with respect to the plane parallel to the interface (IP in FIG. 2) between the silicon nitride layer 14 and the silicon oxide layer 16.

By reducing the first tilt angle $\theta 1$ of the inner surface of the upper portion of the connection hole 54, the embeddability at the time of embedding the metal film 60 is improved. Therefore, the occurrence of voids is suppressed. Further, by increasing the second tilt angle $\theta 2$ of the inner surface of the lower portion of the connection hole 54, it is possible to secure the contact area between the via plug 26 and the lower wiring layer 22, and an increase in the contact resistance between the via plug 26 and the lower wiring layer 22 is suppressed.

Therefore, it becomes possible to connect the lower wiring layer 22 and the upper wiring layer 24 with a low resistance.

The first tilt angle $\theta 1$ is preferably equal to or more than 70 degrees and less than 85 degrees, and more preferably equal to or more than 75 degrees and equal to or less than 84 degrees. If it is less than the above range, the diameter of the upper portion of the via plug 26 becomes large, and the chip size may be increased if it is more than the above range, the embeddability of the metal film 60 may be degraded.

The second tilt angle $\theta 2$ is preferably equal to or more than 85 degrees and equal to or less than 90 degrees, and more preferably equal to or more than 87 degrees and equal to or less than 89 degrees. If it is less than the above range, the resistance of the via plug 26 may be too high. If it is more than the above range, the embeddability of the metal film 60 may be degraded.

As described above, according to the semiconductor device of the embodiment, a semiconductor device capable of connecting the lower layer wiring and the upper layer wiring with a low resistance can be realized.

While certain embodiments have been described, these embodiments have been presented by way of example only, and are not intended to be limited to the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first conductive layer containing copper;
    a second conductive layer containing copper;
    a silicon nitride layer provided between the first conductive layer and the second conductive layer;
    a silicon oxide layer provided between the silicon nitride layer and the second conductive layer and thicker than the silicon nitride layer;
    a silicon oxynitride layer provided between the silicon oxide layer and the second conductive layer and thicker than the silicon oxide layer;
    a third conductive layer provided between the first conductive layer and the second conductive layer, the third conductive layer containing copper and electrically connected to the first conductive layer and the second conductive layer;
    a first coil; and
    a second coil, wherein
    a first tilt angle of a plane where the third conductive layer is in contact with the silicon oxynitride layer with respect to a plane parallel to an interface between the silicon nitride layer and the silicon oxide layer is smaller than a second tilt angle of a plane where the third conductive layer is in contact with the silicon oxide layer with respect to a plane parallel to the interface, and the silicon nitride layer, the silicon oxide layer, and the silicon oxynitride layer are provided between the first coil and the second coil.

2. The semiconductor device according to claim 1, wherein a distance between the first conductive layer and the second conductive layer is equal to or more than 6 µm.

3. The semiconductor device according to claim 1, wherein the first tilt angle is equal to or more than 70 degrees and less than 85 degrees, and the second tilt angle is equal to or more than 85 degrees and equal to or less than 90 degrees.

4. The semiconductor device according to claim 1, wherein a width of a plane where the first conductive layer and the third conductive layer are in contact with each other is equal to or more than 6 µm.

5. The semiconductor device according to claim 1, wherein the first coil and the first conductive layer are formed of the same material, and the second coil and the second conductive layer are formed of the same material.

6. The semiconductor device according to claim 2, wherein the first tilt angle is equal to or more than 70 degrees and less than 85 degrees, and the second tilt angle is equal to or more than 85 degrees and equal to or less than 90 degrees.

7. The semiconductor device according to claim 6, wherein a width of a plane where the first conductive layer and the third conductive layer are in contact with each other is equal to or more than 6 µm.

8. The semiconductor device according to claim 1, wherein a third length of an interface between the third conductive layer and the silicon oxynitride layer in a cross section parallel to a direction from the first conductive layer towards the second conductive layer is larger than a second length of an interface between the third conductive layer and the silicon oxide layer in the cross section, and the second length is larger than a first length of an interface between the third conductive layer and the silicon nitride layer in the cross section.

9. The semiconductor device according to claim 1, wherein the first coil and the first conductive layer contact the silicon nitride layer and, and the second coil and the second conductive layer contact the silicon oxynitride layer.

10. The semiconductor device according to claim 9, wherein a top surface of the first coil and a top surface of the first conductive layer contact the silicon nitride layer and, and a bottom surface of the second coil and a bottom surface of the second conductive layer contact the silicon oxynitride layer.

* * * * *